(12) United States Patent
Trickett et al.

(10) Patent No.: US 8,476,165 B2
(45) Date of Patent: Jul. 2, 2013

(54) METHOD FOR THINNING A BONDING WAFER

(75) Inventors: Douglas M Trickett, Altamont, NY (US); Atsushi Yamashita, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 651 days.

(21) Appl. No.: 12/728,550

(22) Filed: Mar. 22, 2010

(65) Prior Publication Data

US 2010/0255682 A1 Oct. 7, 2010

Related U.S. Application Data

(60) Provisional application No. 61/165,898, filed on Apr. 1, 2009.

(51) Int. Cl.
*H01L 21/302* (2006.01)

(52) U.S. Cl.
USPC ........... 438/692; 438/694; 438/753; 438/756; 438/757

(58) Field of Classification Search
USPC .......................... 438/692, 694, 753, 756, 757
See application file for complete search history.

(56) References Cited

U.S. PATENT DOCUMENTS

| | | | |
|---|---|---|---|
| 5,668,045 A * | 9/1997 | Golland et al. | 438/459 |
| 6,113,721 A | 9/2000 | Secco d'Aragona et al. | |
| 6,417,108 B1 | 7/2002 | Akino et al. | |
| 6,624,047 B1 * | 9/2003 | Sakaguchi et al. | 438/458 |
| 6,641,464 B1 | 11/2003 | Steere | |
| 7,129,172 B2 * | 10/2006 | Morrow et al. | 438/690 |
| 7,256,105 B2 * | 8/2007 | Yamaguchi | 438/459 |
| 2005/0161808 A1 | 7/2005 | Anderson | |
| 2008/0044984 A1 * | 2/2008 | Hsieh et al. | 438/459 |
| 2009/0095399 A1 * | 4/2009 | Zussy et al. | 156/60 |
| 2009/0218560 A1 * | 9/2009 | Flaim et al. | 257/9 |
| 2010/0248414 A1 * | 9/2010 | Liu et al. | 438/70 |

* cited by examiner

*Primary Examiner* — Binh X Tran

(57) ABSTRACT

A method is provided for thinning a wafer, for example a wafer containing Through Silicon Vias (TSV). The method includes providing a bonding wafer coupled to a handling wafer, and performing a wafer edge trimming process that forms a trimmed bonding wafer, where the wafer edge trimming process removes an edge portion of the bonding wafer and exposes an upper surface of the handling wafer. The method further includes forming a protective mask on the trimmed bonding wafer and on the exposed upper surface of the handling wafer, planarizing the protective mask and the trimmed bonding wafer, and selectively removing the planarized protective mask by an etching process. In one embodiment, the removing includes performing a first wet etching process that selectively removes a portion of the planarized trimmed bonding wafer relative to the planarized protective mask, and performing a second wet etching process that selectively removes the planarized protective mask.

20 Claims, 3 Drawing Sheets

METHOD FOR THINNING A BONDING WAFER

CROSS REFERENCE TO RELATED APPLICATION

This application claims priority to U.S. provisional application Ser. No. 61/165,898, filed on Apr. 1, 2009, the entire contents of which are herein incorporated by reference.

FIELD OF INVENTION

The present invention relates to the field of semiconductor manufacturing, and more particularly, to methods for thinning a bonded wafer, for example a wafer containing Through Silicon Vias (TSV).

BACKGROUND OF THE INVENTION

As is known, wafers for the semiconductor industry have been bonded together by a bonding layer in a sandwich type relation for various applications. Further, for these applications, the top wafer diameter needs to be reduced while the diameter of the bottom or handling wafer remains unchanged. In cases where the bonding layer does not extend to the outer diameter, the top wafer is thinned down to microns of thickness and the unsupported area beyond the bonding layer becomes problematic. The thinning process tends to chip the unsupported wafer edge and the debris created causes scratching and subsurface damage on the prime surface of the wafer. Furthermore, in the chase of wafer thinning processes that utilize wet etching, exposed areas of the bonding layer may be chemically etched or attacked by the wet etching chemicals, thereby compromising the structural integrity of a device containing the top wafer and possibly lead to a loss of yield. A more extreme example of the damage is that large pieces of the top wafer break off with the bonding layer attached.

Prior art methods have been used to try to solve the problem stated above. One such method includes photolithography and etch techniques to remove a perimeter of the top wafer. However, this technique is costly and adds long cycle times to the processing. Another solution that has been introduces to solve this problem is to reduce the diameter of the top wafer by using a fixed abrasive grind wheel on a conventional edge grinder. Such applications are currently performed by companies producing SOI wafers (silicon on insulator) and result in a ledge being formed along the periphery of the handling wafer while the diameter of the upper wafer is reduced. However, the side of the top wafer is not protected and mechanical damage can occur during subsequent planarization and thinning of the top wafer and the bonding layer may be damaged. In the case of wet etching processes, a chemical attack on the bonding layer can create mechanical instability of the device and increase the probability of damage. Furthermore, trapped chemical species on the bonded side of the top wafer can diffuse to other areas of the top wafer and degrade or destroy the device.

Therefore, new wafer thinning methods are needed that prevent chipping of the edges of the top wafer and mask wet etching chemicals from the bonding film during a wafer thinning process.

SUMMARY OF THE INVENTION

A method is provided for thinning a wafer, for example a wafer containing Through Silicon Vias (TSV).

In one embodiment, the method includes providing a bonding wafer coupled to a handling wafer, performing a wafer edge trimming process that forms a trimmed bonding wafer, where the wafer edge trimming process removes an edge portion of the bonding wafer and exposes an upper surface of the handling wafer. The method further includes forming a protective mask on the trimmed bonding wafer and on the exposed upper surface of the handling wafer, planarizing the protective mask and the trimmed bonding wafer, and removing the planarized protective mask by an etching process.

In another embodiment, the method includes providing a silicon bonding wafer coupled to a handling wafer by a low-k bonding layer, where the silicon bonding wafer contains metal filled vias extending through at least a portion of a thickness of the silicon bonding wafer, performing a wafer edge trimming process that forms a trimmed silicon bonding wafer, where the wafer edge trimming process removes an edge portion of the silicon bonding wafer and exposes an upper surface of the handling wafer. The method further includes forming a protective mask by a spin-on process on the trimmed silicon bonding wafer and on the exposed upper surface of the handling wafer, where the protective mask comprises an oxide film, a nitride film, or an oxynitride film, planarizing the protective mask and the trimmed silicon bonding wafer, performing a first wet etching process that selectively removes a portion of the planarized trimmed silicon bonding wafer relative to the protective mask, and after the first wet etching process, performing a second wet etching process that selectively removes the planarized protective mask.

In yet another embodiment, the method includes providing a silicon bonding wafer coupled to a handling wafer by a low-k bonding layer, where the silicon bonding wafer contains metal filled vias extending through at least a portion of a thickness of the silicon bonding wafer, and where the metal filled vias are in direct contact with the bonding layer, performing a wafer edge trimming process that forms a trimmed silicon bonding wafer, where the wafer edge trimming process removes an edge portion of the silicon bonding wafer and exposes an upper surface of the handling wafer. The method further includes forming a protective mask by a spin-on process on the trimmed silicon bonding wafer and on the exposed upper surface of the handling wafer, where the protective mask comprises a $SiO_2$ film, planarizing the protective mask and the trimmed silicon bonding wafer, performing a first wet etching process that selectively removes a portion of the planarized trimmed silicon bonding wafer relative to the protective mask, where the first wet etching process comprises exposing the planarizing protective mask and the planarized trimmed silicon bonding wafer to a liquid bath containing TMAH (tetramethyl ammonium hydroxide), HNA (aqueous solution containing hydrogen fluoride, nitric acid, and acetic acid), or KOH (potassium hydroxide), and after the first wet etching process, performing a second wet etching process that selectively removes the planarized protective mask, where the second wet etching process comprises exposing the planarized protective mask to liquid bath containing an organic solvent, or an aqueous solution, where the aqueous solution includes an aqueous solution of hydrogen fluoride.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Methods for thinning wafers, for example wafers containing Through Silicon Vias (TSV), are disclosed in various embodiments.

Figure 1A:
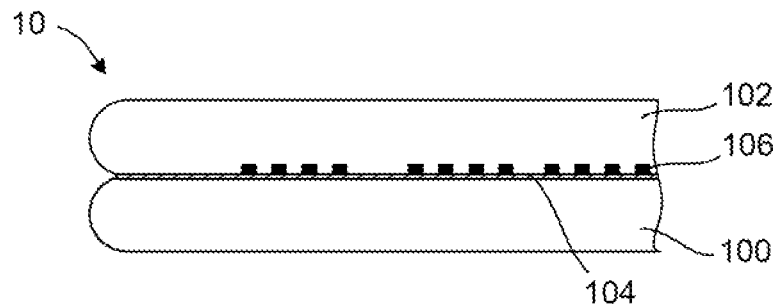
FIGS. 1A-1F schematically show cross-sectional views of a process of thinning wafers containing Through Silicon Vias according to embodiments of the invention.

FIG. 1A schematically shows a structure 10 containing a handling wafer 100 coupled to a silicon bonding wafer 102 using a bonding layer 104. The handling wafer 100 and the silicon bonding wafer 102 may be silicon wafers having a radius of 100 mm, 150 mm, 225 mm, or larger. Furthermore, the handling wafer 100 and the silicon bonding wafer 102 may each have total thickness of approximately 1 mm. The silicon bonding wafer 102 further contains a plurality of metal filled vias (holes) 106 in contact with the bonding layer 104. The metal filled vias 106 can, for example, have a diameter between about 1 micron (micron=$10^{-6}$ meter) and about 50 microns, for example about 25 microns or about 40 microns. In one example, the metal filled vias 106 may have a diameter of about 25 microns and a height of about 25 microns. In some examples, the metal filled vias 106 can contain or consist of Cu metal. As schematically shown in FIG. 1A, the metal filled vias 106 may extend through only a lower portion of the thickness of the silicon bonding wafer 102.

The bonding layer 104 can, for example, include a low dielectric constant (low-k) material having a dielectric constant lower than that of $SiO_2$ (k~3.9). Such low-k materials can be deposited by a spin-on dielectric (SOD) method similar to the application of photo-resist, by chemical vapor deposition (CVD), or physical vapor deposition (PVD). Low-k dielectric materials may have a dielectric constant of less than 3.7, or a dielectric constant ranging from 1.6 to 3.7. Low-k dielectric materials can include fluorinated silicon glass (FSG), carbon doped oxide, a polymer, a SiCOH-containing low-k material, a non-porous low-k material, a porous low-k material, a spin-on dielectric (SOD) low-k material, or any other suitable dielectric material. The low-k dielectric material can include BLACK DIAMOND® (BD) or BLACK DIAMOND® II (BDII) SiCOH material, commercially available from Applied Materials, Inc., or Coral® CVD films commercially available from Novellus Systems, Inc. Other commercially available carbon-containing materials include SiLK® (e.g., SiLK-I, SiLK-J, SiLK-H, SiLK-D, and porous SiLK semiconductor dielectric resins) and CYCLOTENE® (benzocyclobutene) available from Dow Chemical, and GX-3™, and GX-3P™ semiconductor dielectric resins available from Honeywell. In addition, low-k materials can include a silicate-based material, such as hydrogen silsesquioxane (HSQ) or methyl silsesquioxane (MSQ), deposited using SOD techniques. Examples of such films include FOx® HSQ commercially available from Dow Corning, XLK porous HSQ commercially available from Dow Corning, and JSR LKD-5109 commercially available from JSR Microelectronics.

Figure 1B:
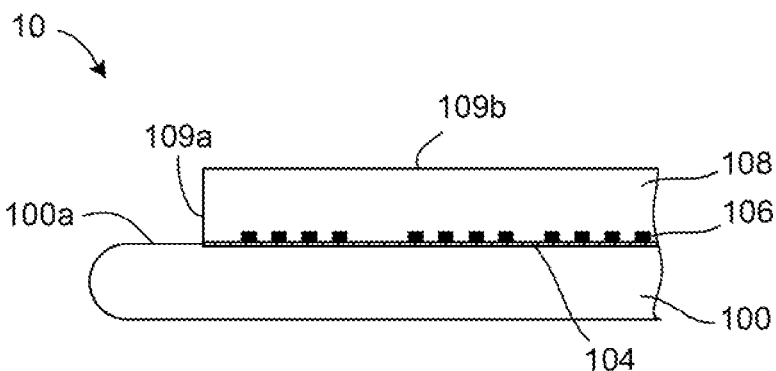

FIG. 1B shows the structure 10 following a wafer edge trimming process where an edge portion of the silicon bonding wafer 102 and the bonding layer 104 are removed. The resulting trimmed silicon bonding wafer 108 has an upper surface 109b and a sidewall surface 109a above an exposed upper surface 100a of the handling wafer 100. In some examples, the wafer edge trimming process may include a mechanical grinding process.

Figure 1C:
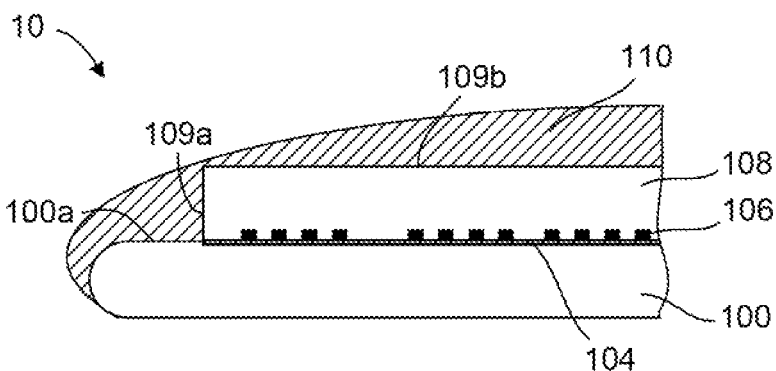

FIG. 1C shows a protective mask 110 formed on the structure 10 according to an embodiment of the invention. The protective mask 110 coats the entire trimmed silicon bonding wafer 108, including the sidewall surface 109a and the upper surface 109b, and the upper surface 100a of the handling wafer 100. The protective mask 110 may contain or consist of an oxide film (e.g., $SiO_2$), a nitride film (e.g., SiN), or an oxynitride film (e.g., SiON).

According to one embodiment of the invention, the protective mask 110 may be deposited by a spin-on process. The spin-on process can include coating the structure 10 with material that is originally in the liquid form, where the liquid is dispensed onto the wafer surfaces in predetermined amount and the wafers are rapidly rotated. During the rotating (spinning), liquid is uniformly distributed on the surfaces by centrifugal forces, and the material is then solidified by a low temperature bake.

According to some embodiments of the invention, the protective mask 110 may be deposited by a chemical vapor deposition (CVD) process, a plasma-enhanced CVD (PECVD) process, or a physical vapor deposition (PVD) process. In one example, a conformal protective mask 110 may be formed over the surfaces 109a, 109b, and 100a.

Figure 1D:
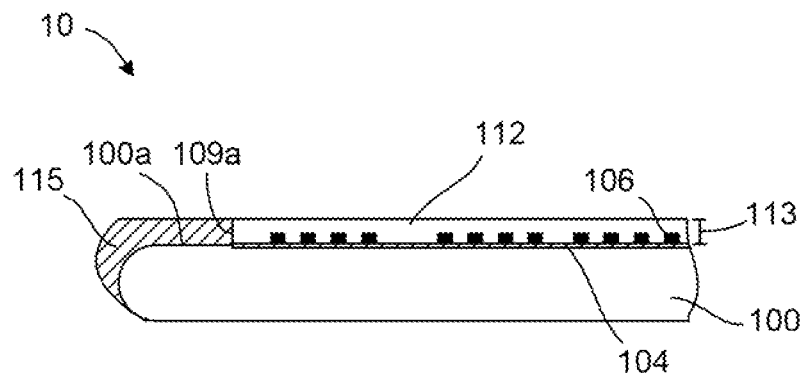

FIG. 1D shows the structure 10 following a wafer planarizing process. The wafer planarizing process removes the portion of the protective mask 110 on the upper surface 109b and reduces the thickness the trimmed silicon bonding wafer 108 from an initial thickness (e.g., about 1 mm) to a thickness 113 (e.g., about 50 microns). The wafer planarizing process further reduces the thickness of the protective mask 110 on the upper surface 100a of the handling wafer 100. As depicted in FIG. 1D, the resulting structure 10 is planarized and contains planarized protective mask 115 and planarized trimmed silicon bonding wafer 112. In some examples, the wafer planarizing process may be a mechanical grinding process or a chemical mechanical polishing (CMP) process.

Figure 1E:
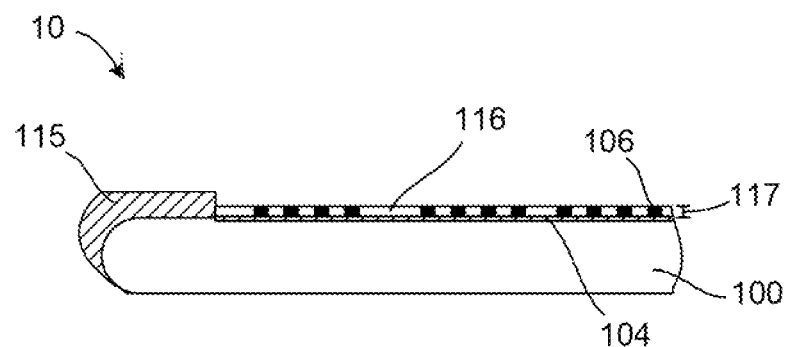

FIG. 1E shows the structure 10 following a first wet etching process that forms an etched planarized trimmed silicon bonding wafer 116 with a thickness 117. The first wet etching process can be highly selective to removal of the silicon material of the planarized trimmed silicon bonding wafer 112 compared to removal of the material (e.g., $SiO_2$) of the planarized protective mask 115. According to some embodiments of the invention, the first wet etching process may be performed in a liquid bath containing TMAH (tetramethyl ammonium hydroxide), HNA (aqueous solution containing hydrogen fluoride, nitric acid, and acetic acid), or KOH (potassium hydroxide). According to some embodiments of the invention, the first wet etching process may be performed in a liquid bath consisting of TMAH, HNA, or KOH. However, other liquid baths may be used that contain one or more etchants that provide etch good selectivity between the planarized protective mask 115 and planarized trimmed silicon bonding wafer 112.

As shown in FIGS. 1D and 1E, the presence of the planarized protective mask 115 protects the sidewall surface 109a of the planarized trimmed silicon bonding wafer 112 during the wafer thinning process. In particular, the planarized protective mask 115 prevents chipping of the edges of the silicon bonding wafer 112 and masks wet etching chemicals from the bonding film 104 during a wafer thinning process.

According to one embodiment of the invention, the thickness 117 of the etched planarized trimmed silicon bonding wafer 116 can be equal to or approximately equal to the original height of the metal filled vias 106 in FIG. 1D. In the embodiment depicted in FIG. 1E, upper surfaces of the metal filled vias 106 are exposed following the first wet etching process.

Figure 1F:
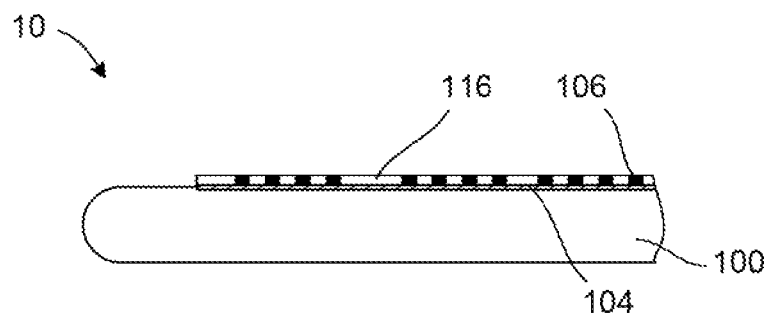

FIG. 1F shows the structure 10 following a second wet etching process that removes the planarized protective mask 115 from the handling wafer 100 without removing or thinning the etched planarized trimmed silicon bonding wafer 116. According to one embodiment of the invention, the second wet etching process may be performed in a liquid bath containing an organic solvent, or an aqueous solution, where the aqueous solution includes an aqueous solution of hydrogen fluoride. In one example, the aqueous solution consists of an aqueous solution of hydrogen fluoride. However, other liquid baths may be used that contain one or more etchants that provide etch good selectivity between the planarized protective mask 115 and etched planarized trimmed silicon bonding wafer 116.

Referring back to FIGS. 1C and 1D, the protective mask 110 can prevent or reduce mechanical damage to the sidewall surface 109a of the planarized trimmed silicon bonding wafer 108 during the wafer planarizing process that was described above and forms the planarized silicon bonding wafer 112. Furthermore, the planarized protective mask 115 shown in FIG. 1D can prevent or reduce damage to the bonding layer 104 during the first wet etching process. Potential damage to the bonding layer 104 can include partial removal (undercutting) of the portion of the bonding layer 104 exposed to the liquid bath used in the first wet etching process.

Following the second wet etching process, the structure 10 shown in FIG. 1F may be further processed to form a semiconductor device. The further processing can include removing the handling wafer 100 from the wet etched silicon bonding wafer 116.

Figure 2A:
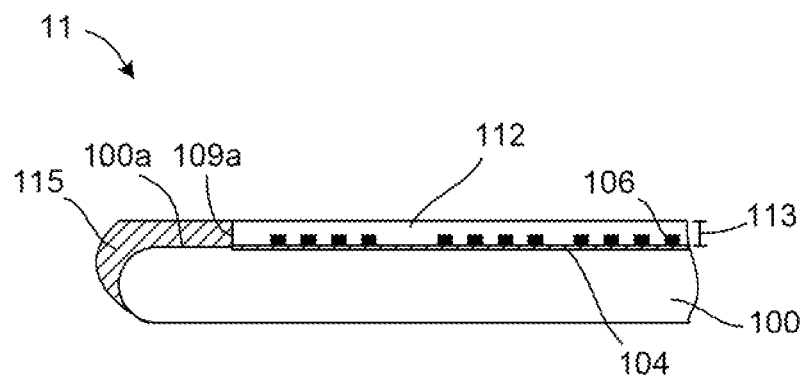
FIGS. 2A-2C schematically show cross-sectional views of a process of thinning wafers containing Through Silicon Vias according to other embodiments of the invention.
Figure 2B:
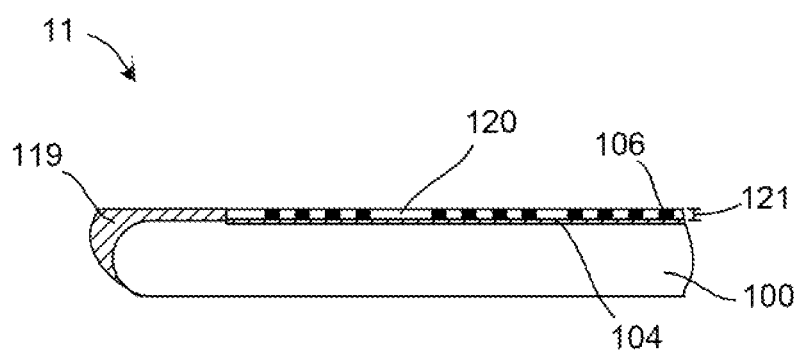
Figure 2C:
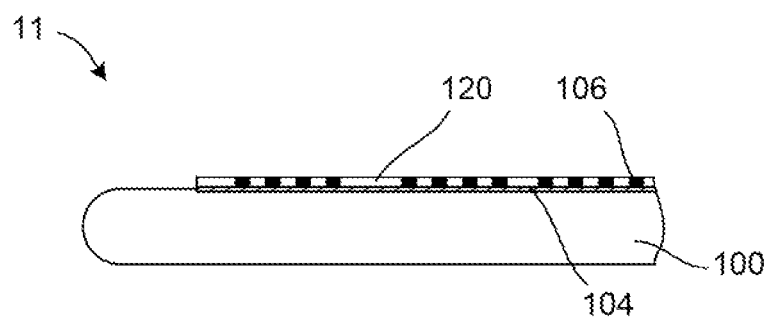

FIGS. 2A-2C schematically show cross-sectional views of a process of thinning wafers containing Through Silicon Vias according to other embodiments of the invention. The structure 10 from FIG. 1D is reproduced in FIG. 2A. According to the embodiment depicted in FIG. 2A-2C, the structure 10 may be further planarized to yield the structure 11 shown in FIG. 2B. The further planarizing may be performed by extending the first planarizing process described in FIG. 1D or by performing a second wafer planarizing process that uses different planarizing conditions than the first planarizing process. In some examples, the second planarizing process may have a lower rate of material removal than the first planarizing process.

The wafer planarizing process depicted in FIGS. 2A-2B further reduces the thickness of the planarized protective mask 115 on the upper surface 100a of the handling wafer 100 and reduces the thickness 113 of the planarized trimmed silicon bonding wafer 112 to a thickness 121. As depicted in FIG. 2B, the resulting structure 11 is planarized and contains planarized protective mask 119 and planarized trimmed silicon bonding wafer 120.

FIG. 2C shows the structure 11 following a wet etching process that removes the planarized protective mask 119 from the handling wafer 100 without removing the planarized trimmed silicon bonding wafer 120. According to one embodiment of the invention, the wet etching process may be performed in a liquid bath containing an organic solvent, or an aqueous solution, where the aqueous solution includes an aqueous solution of hydrogen fluoride. However, other liquid baths may be used that contain one or more etchants that provide etch good selectivity between the planarized protective mask 119 and planarized silicon bonding wafer 120.

A plurality of procedures for thinning wafers, for example wafers containing Through Silicon Vias (TSV), have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film or a layer "on" a wafer be directly on and in immediate contact with the wafer; there may be a second film or second layer or other structure between the film or layer and the wafer.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for thinning a wafer, the method comprising:
providing a bonding wafer coupled to a handling wafer;
performing a wafer edge trimming process that forms a trimmed bonding wafer, wherein the wafer edge trimming process removes an edge portion of the bonding wafer and exposes an upper surface of the handling wafer;
forming a protective mask on the trimmed bonding wafer and on the exposed upper surface of the handling wafer;
planarizing the protective mask and the trimmed bonding wafer; and
removing the planarized protective mask by an etching process.

2. The method of claim 1, wherein the protective mask comprises an oxide film, a nitride film, or an oxynitride film, or any combination thereof.

3. The method of claim 1, wherein the protective mask comprises a $SiO_2$ film, a SiN film, or a SiON film, or any combination thereof.

4. The method of claim 1, wherein forming the protective mask comprises a spin-on process, a chemical vapor deposition (CVD) process, a plasma-enhanced CVD (PECVD) process, or a physical vapor deposition (PVD) process.

5. The method of claim 1, wherein the bonding wafer contains metal filled vias extending through at least a portion of a thickness of the bonding wafer.

6. The method of claim 1, wherein the planarizing comprises a mechanical grinding process or a chemical mechanical polishing process.

7. The method of claim 1, wherein the removing comprises performing a wet etching process.

8. The method of claim 7, wherein the wet etching process comprises exposing the planarized protective mask to a liquid bath containing an organic solvent, or an aqueous solution, wherein the aqueous solution includes an aqueous solution of hydrogen fluoride.

9. The method of claim 1, wherein the removing comprises performing a first wet etching process that selectively removes a portion of the planarized trimmed bonding wafer relative to the planarized protective mask; and performing a second wet etching process that selectively removes the planarized protective mask.

10. The method of claim 9, wherein the first wet etching process comprises exposing the planarizing protective mask and the planarized trimmed bonding wafer to a liquid bath containing TMAH (tetramethyl ammonium hydroxide), HNA (aqueous solution containing hydrogen fluoride, nitric acid, and acetic acid), or KOH (potassium hydroxide).

11. The method of claim 9, wherein the second wet etching process comprises exposing the planarized protective mask to a liquid bath containing an organic solvent, or an aqueous solution, wherein the aqueous solution includes an aqueous solution of hydrogen fluoride.

12. The method of claim 1, wherein the bonding wafer is coupled to the handling wafer by a bonding layer.

13. The method of claim 12, wherein the bonding layer comprises a SiCOH-based low-k material.

14. The method of claim 12, wherein the bonding wafer contains metal filled vias extending through at least a portion of a thickness of the bonding wafer and wherein the metal filled vias are in direct contact with the bonding layer.

15. A method for thinning at least one silicon bonding wafer, the method comprising:
   providing a silicon bonding wafer coupled to a handling wafer by a low-k bonding layer, wherein the silicon bonding wafer contains metal filled vias extending through at least a portion of a thickness of the silicon bonding wafer;
   performing a wafer edge trimming process that forms a trimmed silicon bonding wafer, wherein the wafer edge trimming process removes an edge portion of the silicon bonding wafer and exposes an upper surface of the handling wafer;
   forming a protective mask by a spin-on process on the trimmed silicon bonding wafer and on the exposed upper surface of the handling wafer, wherein the protective mask comprises an oxide film, a nitride film, or an oxynitride film;
   planarizing the protective mask and the trimmed silicon bonding wafer, wherein the protective mask is removed from the trimmed silicon bonding wafer;
   performing a first wet etching process that selectively removes a portion of the planarized trimmed silicon bonding wafer relative to the protective mask; and
   after the first wet etching process, performing a second wet etching process that selectively removes the planarized protective mask.

16. The method of claim 15, wherein the low-k bonding layer comprises a SiCOH-based low-k material.

17. The method of claim 15, wherein the first wet etching process comprises exposure to a liquid bath containing TMAH (tetramethyl ammonium hydroxide), HNA (aqueous solution containing hydrogen fluoride, nitric acid, and acetic acid), or KOH (potassium hydroxide).

18. The method of claim 15, wherein the second wet etching process comprises exposure to a liquid bath containing an organic solvent, or an aqueous solution, wherein the aqueous solution includes an aqueous solution of hydrogen fluoride.

19. The method of claim 15, wherein the metal filled vias are in direct contact with the bonding layer.

20. A method for thinning at least one silicon wafer, the method comprising:
   providing a silicon bonding wafer coupled to a handling wafer by a low-k bonding layer, wherein the silicon bonding wafer contains metal filled vias extending through at least a portion of a thickness of the silicon bonding wafer, and wherein the metal filled vias are in direct contact with the bonding layer;
   performing a wafer edge trimming process that forms a trimmed silicon bonding wafer, wherein the wafer edge trimming process removes an edge portion of the silicon bonding wafer and exposes at least one upper surface of the handling wafer;
   forming a protective mask by a spin-on process on the trimmed silicon bonding wafer and on the exposed upper surface of the handling wafer, wherein the protective mask comprises a $SiO_2$ film;
   planarizing the protective mask and the handling wafer, wherein the protective mask is removed from an upper surface of the trimmed silicon bonding wafer;
   performing a first wet etching process that selectively removes a portion of the planarized trimmed silicon bonding wafer relative to the protective mask, wherein the first wet etching process comprises exposing the planarizing protective mask and the planarized trimmed silicon bonding wafer to a liquid bath containing TMAH (tetramethyl ammonium hydroxide), HNA (aqueous solution containing hydrogen fluoride, nitric acid, and acetic acid), or KOH (potassium hydroxide), and
   after the first wet etching process, performing a second wet etching process that selectively removes the planarized protective mask, wherein the second wet etching process comprises exposing the planarized protective mask to liquid bath containing an organic solvent, or an aqueous solution, wherein the aqueous solution includes an aqueous solution of hydrogen fluoride.

* * * * *